United States Patent [19]

Yoo et al.

[11] Patent Number: 5,203,957
[45] Date of Patent: Apr. 20, 1993

[54] CONTACT SIDEWALL TAPERING WITH ARGON SPUTTERING

[75] Inventors: Chue-San Yoo, Taipei; Ting-Hwang Lin; Sui-Hei Kuo, both of Hsin-Chu, all of Taiwan

[73] Assignee: Taiwan Semiconductor manufacturing Company, Hsinchu, Taiwan

[21] Appl. No.: 713,508

[22] Filed: Jun. 12, 1991

[51] Int. Cl.$^5$ .......................................... H01L 21/00
[52] U.S. Cl. .................................. 156/643; 156/644; 156/646; 156/656; 156/657; 204/192.32; 204/192.35; 204/192.37; 437/195
[58] Field of Search ............... 156/644, 657, 656, 643, 156/646; 204/192.32, 192.35, 193.37; 437/203, 228, 200, 193

[56] References Cited

U.S. PATENT DOCUMENTS

| | | | |
|---|---|---|---|
| 4,372,034 | 2/1983 | Bohr | 437/51 |
| 4,764,245 | 8/1988 | Grewal | 156/657 X |
| 4,807,016 | 2/1989 | Douglas | 156/644 X |
| 4,814,041 | 3/1989 | Auda | 156/644 X |
| 4,857,141 | 8/1989 | Abe et al. | 156/657 X |
| 4,902,377 | 2/1990 | Berglund et al. | 156/644 X |
| 4,931,411 | 6/1990 | Tigelaar et al. | 437/200 X |
| 5,104,822 | 4/1992 | Butler | 437/193 |

FOREIGN PATENT DOCUMENTS 57-20450 2/1982 Japan.
57-69745 4/1982 Japan.
61-288428 12/1986 Japan.

Primary Examiner—Thi Dang
Attorney, Agent, or Firm—George O. Saile

[57] ABSTRACT

The method for making a contact opening for an integrated circuit having a feature size of about one micrometer or less is accomplished by first providing an integrated circuit structure having device elements within a semiconductor substate and multilayer insulating layers thereover. A resist masking layer is formed over the multilayer insulating layer having openings therein in the areas where the contact openings are desired. Isotropic etching is done through a desired thickness portion of multilayer insulating layer. Anisotropic etching is now done through the remaining thickness of multilayer insulating layer to the semiconductor substrate to form the desired contact opening. The resist layer is removed. The structure is subjected to an Argon sputter etching ambient to smooth the sharp corners at the upper surface of multilayer layer and the point where the isotropic etching ended and the anisotropic etching began. It is preferred that soft reactive ion etching be done for a period of less than about 30 seconds after said Argon sputter etching to reduce the increased contact resistance caused by this Argon sputter etching.

20 Claims, 2 Drawing Sheets

CONTACT SIDEWALL TAPERING WITH ARGON SPUTTERING

BACKGROUND OF THE INVENTION (1) Field of the Invention

The invention relates to the manufacture of very highly dense integrated circuits and more particularly to the method of formation of tapered contact opening to device elements of the integrated circuits.

(2) Description of the Prior Art

Insulating multilayers are normally formed over the highly dense integrated circuits which are formed in and on a semiconductor substrate. These layers are thick in comparison to the feature size of one micrometer or less of the very dense integrated circuits which are now being manufactured. This thickness cannot be scaled down proportionately in the same way the feature size is scaled down. The layers are composed of silicon oxide, silicon nitride, glasses and the like insulators.

It is necessary to make tapered contact openings through this relatively thick insulating multilayer to the device elements formed in and on the semiconductor substrate. These openings are formed by isotropic etching, anisotropic etching or a combination of these two etching techniques and heating steps to cause smoothing by flow of the insulator layer. A great amount of work and effort has been expended to find the best technique to form ideal tapered openings to the device elements. The need for tapered openings is so that the subsequent step of depositing a metal layer, for example aluminum will properly fill the opening and make an ohmic contact to the various device elements of the integrated circuit. Examples of patents that have tried to solve this problem are R.K. Berglund et al U.S. Pat. No. 4,902,377 and B. Auda U.S. Pat. No. 4,814,041.

Argon sputter etching has been known as an etching technique for many years and had been used in the past where simpler semiconductor device were being made. This process is not used today in making contact openings, because it is known that the contact resistance and other contact properties would be adversely effected.

It has been recognized in the prior art that the high temperature heating that is generally used to flow the insulating layer, typically glass to smooth the sharp edges of contact opening can do damage to the integrated circuit device elements. For example, M.T. Bohr U.S. Pat. No. 4,372,034 describes a process wherein he uses a very deep isotropic etch through the glass insulating layer and then an anisotropic etch to pass through the thin silicon dioxide layer. He says that the high temperature heating step is not now required. However, this process can only be used in the past or where very simple and large size semiconductor devices are being made, because of the very large space taken up by the isotropic etch at each opening.

The high density integrated circuit devices wherein the feature sizes are less than about one micrometer or less have created very difficult problems involving the conservation of horizontal space. Also, there is the problem of the high temperature flow of the glass insulating layer for smoothing. The high temperature flow causes device problems, such as where a refractory silicide, for example titanium silicide is used in the conventional SALICIDE process. The major device problem caused in this instant is the high temperature increase in contact resistance due to silicide degradation. The longer cycle time of manufacture is another disadvantage of the high temperature flow step.

SUMMARY OF THE INVENTION

It is an object of this invention to overcome the disadvantages of the prior art in forming tapered contact openings by use of a combination of isotropic etching, anisotropic etching and an Argon sputter etching to form ideal tapered openings without use of a high temperature flow step and while conserving horizontal space.

It is another object of this invention, for nonsilicided devices to effectively use the Argon sputter etching step in combination with the isotropic etching and anisotropic etching without resulting in an unacceptable increase in the contact resistance by following the Argon sputter etching with a short time soft reactive ion etching step to reduce the contact resistance.

The method for making a contact opening for an integrated circuit having a feature size of about one micrometer or less is accomplished by first providing an integrated circuit structure having device elements within a semiconductor substrate and multilayer insulating layers thereover. A resist masking layer is formed over the multilayer insulating layer having openings therein in the areas where the contact openings are desired. Isotropic etching is done through a desired thickness portion of multilayer insulating layer. Anisotropic etching is now done through the remaining thickness of multilayer insulating layer to the semiconductor substrate to form the desired contact opening. The resist layer is removed. The structure is subjected to an Argon sputter etching ambient to smooth the sharp corners at the upper surface of multilayer layer and the point where the isotropic etching ended and the anisotropic etching began. It is preferred that soft reactive ion etching be done for a period of less than about 30 seconds after said Argon sputter etching to reduce the increased contact resistance caused by this Argon sputter etching.

This Argon contact openings tapering has proven to be easy to control and to implement. There are no contact critical dimension variation even applied to contacts of different depths.

The resultant tapered contact openings provide excellent metal step coverage without the high temperature flow step.

DESCRIPTION OF THE PREFERRED EMBODIMENTS

Figure 1:
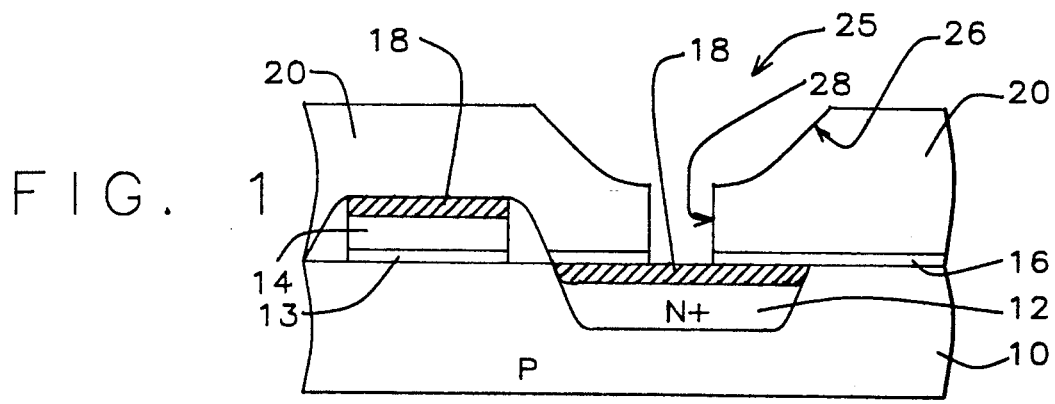
FIG. 1 is a schematic cross-sectional representation of the process of the present invention after the isotropic etching and anisotropic etching steps.

Referring to FIG.1 there is shown a product in a stage of manufacture after the contact windows or openings have been etched by an isotropic etchant and a anisotropic etchant. The product under manufacture can be either an N-channel MOSFET, a P-channel MOSFET, a CMOS FET, bipolar transistor or combinations thereof. However, the FIG. 1 through 4 process is intended to schematically show a NMOS portion of a CMOS FET process that makes a electrical contact to both P+ and N+ source/drain regions. The substrate 10 is monocrystalline silicon and has been doped by conventional techniques to either P or N as is appropriate for the desired N-channel or P-channel MOS FET structure. An example of such a conventional process is described in the book "VLSI TECHNOLOGY" Second Edition by S. M. Sze Published by McGraw-Hill Book Co., New York, N.Y. 1988 Pages 485–487.

Source/drain regions 12, gate dielectric 13 and gate electrode 14 are formed by conventional methods as described, for example by Sze cited above in the appropriate wells of substrate 10. Conventional sidewall insulator structures 17 have been formed upon the sides of the gate dielectric 13 and gate electrode 14 for insulating purposes.

The self aligned metal silicide layer is now to be formed on the polycrystalline silicon regions 14 and the exposed source/drain monocrystalline silicon regions 12. A thin layer of metal film is deposited upon the surface of the wafer. The metals that are useful in may invention include titanium, cobalt, tantalum, molybdenum, tungsten, palladium and platinum. The metal can be deposited by sputtering or evaporation methods. It is preferably deposited by sputtering. The operational thickness is between about 300 to 1500 Angstroms and the preferred thickness is between about 800 to 1000 Angstroms. The preferred metal for this metal silicide is titanium. Alternatively, the metal silicides can be formed with chemical vapor desposition.

The structure having the metal layer formed thereover the layers 14 and source/drain regions 12 is now placed within a chamber having an inert atmosphere such as nitrogen, argon or a vacuum. The structure is heated within this chamber to react the metal with the polycrystalline silicon layer regions and the monocrystalline silicon regions to form metal silicide layers or contacts 18. The metal is left unreacted where it covers the non-silicon regions. The heating conditions for the reaction are 600° to 800° C. in a conventional furnace for about 20 to 40 minutes or in rapid thermal anneal system for 60 to 200 seconds. The unreacted portions of the metal layer are then removed by exposing the structure to an etchant selective for the metal but not reactive to the metal silicide layer or contact 18. Typical etchants are solution of ammonium hydroxide, hydrogen peroxide and DI water. After cleanup the unreacted metal film or metal nitride on the oxide surface, a second anneal either by furnace or by rapid thermal anneal at 800° to 900° C. stabilizers the metal silicide films.

An insulating layered structure composed of a layer of silicon oxide 16 and a much thicker layer of borophosphosilicate glass, phosphosilicate glass or similar insulating layer 20. The operational thicknesses of the layers are between about 1000 to 2000 Angstroms for the oxide layer and between about 4000 to 10,000 or more Angstroms for the glasseous layer. These layers are typically deposited by chemical vapor deposition in low pressure or atmospheric pressure, or in a plasma enhance reactive chamber.

The contact windows or openings 25 are now formed through the insulating layered structure to the source/drain regions 12 having refractory silicide contact 18 thereon in the device regions.

A resist masking layer (not shown) is formed over the layer 18, exposed and developed. The openings in the resist masking layer are at the desired openings or contact windows. Isotropic etching is now done using 10H20:1HF ratio buffered HF water solution. The isotropic etching produces etching in both the vertical and the horizontal directions to produce pattern 26. The isotropic etching is continued to a thickness of between about 3500 to 4500 Angstroms of the layer 20.

Anisotropic etching is now done using plasma etcher and under the conditions Fluorine based chemistry. The anisotropic etching produces etching in only the vertical direction to produce pattern 28. The anisotropic etching continues until the remaining thickness of the multilayered insulating layer is removed and the contact window or opening 25 is produced and FIG. 1 completed.

It should be noted that there are sharp edges at the top of the layer 20 at the openings 25 and at the intersection of patterns 26 and 28. The sharp corners would degrade the metal step coverage, because due to the shadowing effect one would obtain different thicknesses of metal, that is on the vertical contact sidewall there would be less metal than on the horizontal surfaces.

Figure 2:
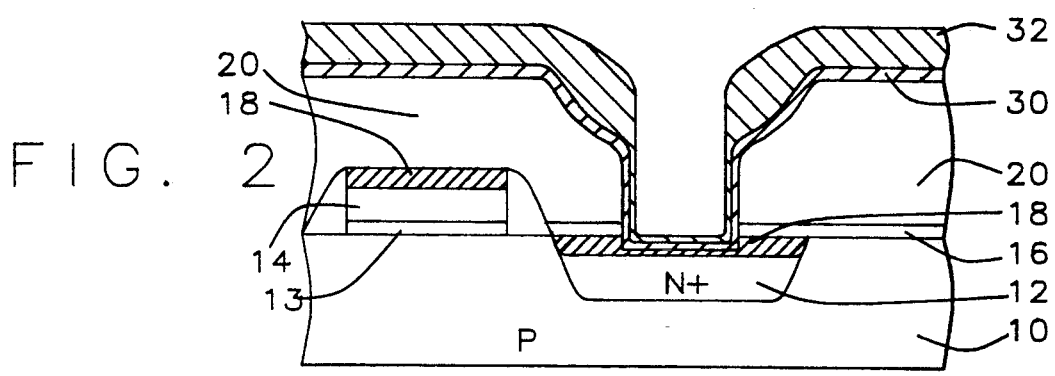
FIG. 2 is a schematic cross-sectional representation of the result of depositing metallurgy into the contact openings where neither Argon sputter etching nor high temperature flow is used.

Referring now to FIG. 2, there is shown the results of depositing metal layers 30, 32 over the openings without further processing. The metal step coverage problem results in an unacceptable contact to the source/drain region 12.

For 0.7 micrometer contact size, with the conventional wet+dry etching, the resultant metal step coverage is 9.6%, whereas if a 2-minute Ar sputtering is applied, the metal step coverage is improved to 52.9%; a 1-minute Ar sputtering to 39.8%.

Figure 3:
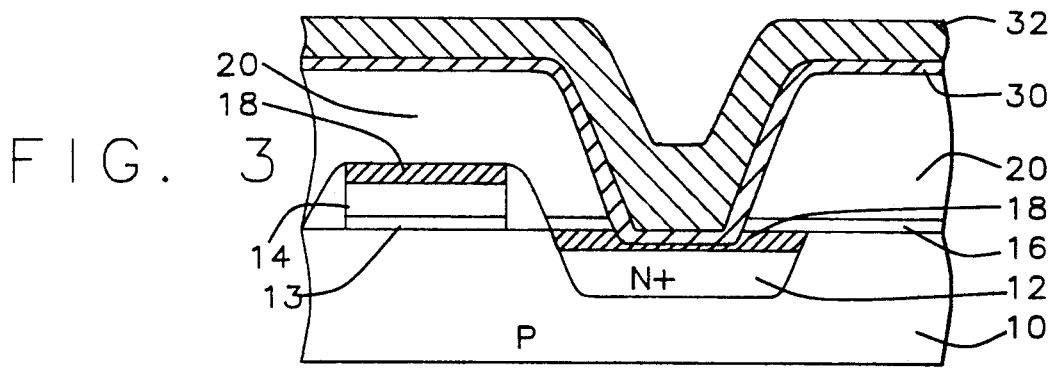
FIG. 3 is a schematic cross-sectional representation of the result of depositing metallurgy in the contact opening where a high temperature flow step is used.

Referring now to FIG. 3, there is shown results of a high temperature flow treatment of 850° to 950° C. for 30 to 60 minutes. There is an increase in contact resistance during the high temperature flow process due to silicided degradation. Further, the long cycle time increases cost.

Figure 4:
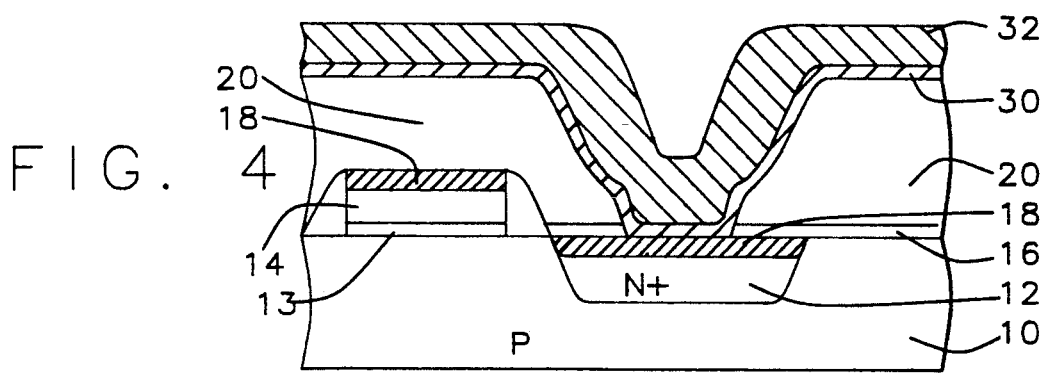
FIG. 4 is a schematic cross-sectional representation of the result of depositing metallurgy in the contact opening after the Argon sputter etching step of the present invention.

Referring now more particularly to FIG. 4 wherein the solution to the problems of the prior can best be understood. The FIG. 1 structure is subjected to an Argon sputter etching ambient to smooth the sharp corners at the upper surface of the multilayer layer 16, 20 and the point where the isotropic etching ended and the anisotropic etching began, that is where patterns 26 and 28 meet.

This smoothing can be controlled depending upon the time that the Argon sputtering continues and the amount of material removed. The Ar plasma is generated with an electrical field and the Ar ion lifetime is prolonged with an magnetic field, so that during etching Ar ions etch the surface. For example, where borophosphosilicate glass is being smoothed, the etching of 500 Angstroms give metal step coverage of about 34%; 750 Angstroms give about 53%; 1000 Angstroms give about 66% and 1250 Angstroms give about 69%. Metal step coverage is defined as the ratio of thickness of the thinnest metal in contact hole to the metal thickness on horizontal area.

For nonsilicided devices, a soft reactive ion etching is preferably now used to reduce the contact resistance that is increased during the Argon sputter etching process described. The soft etching uses carbon tetrafluoride/helium (CF4/He) plasma to remove a very thin layer of the silicon surface. The Argon sputter etching was observed to have no adverse effect upon the titanium silicide integrity as revealed by thermowave counts and sheet resistance. Hence, no contact resistance increase, after the Ar sputtering is observed. Namely, no soft-etching is required.

The contact metallurgy 30, 32 consists typically of titanium (Ti)/titanium-tungsten(TiW)/alumium (Al) are now deposited by a sputtering machine and under the conditions 6 to 12 kwatts. Layer thickness range is 100 to 300 Angstroms for titanium; 1000 to 1500 Angstroms for TiW; 5000 to 9000 Angstroms for Al. The result is that good metal step coverage is found and no high temperature flow processing was needed. For purposes of the drawing the layer 30 includes the Ti/TiW and layer 32 included the Al.

The following Example is given to show the important features of the invention and to aid in the understanding thereof and variations may be made by one skilled in the art without departing from the spirit and scope of the invention.

EXAMPLE

Experiments were carried out on contacts patterned on 7500 Angstroms of borophosphosilicate glass atop 1000 Angstroms of undoped silicon oxide. The contacts were isotropically wet etched with 10 H20:1 HF buffered solution and anisotropically etched with Lam 4500 etcher with carbon tetrafluoride/trifluoromethane plasma at RF power of 750 watts with the resist masking layer in place. The resist masking layer was removed. Argon sputtering was used to etch and smooth the corners caused by the first two etching processes. The contact opening was 0.7 micrometers. The Argon sputter etching was done with an Applied Material P5000 etchback chamber. The RF power used is 400W; the magnetic field is 50 Gauss. The Argon ion preferentially etch faster along 45 degree to the horizontal plane, hence it is capable of rounding off the sharp corners on contact sidewalls. For example, for conventional wet+dry contact etching, the metal step coverage is 9.6% which is improved to 39.8% and 52.9% with a one- and two-minute Ar sputtering respectively. The metal contacts, consisting of Aluminum, silicon and copper, was deposited by ULVAC system. The power used is 12 kw; pressure at 10−8 torr.

Figure 5:
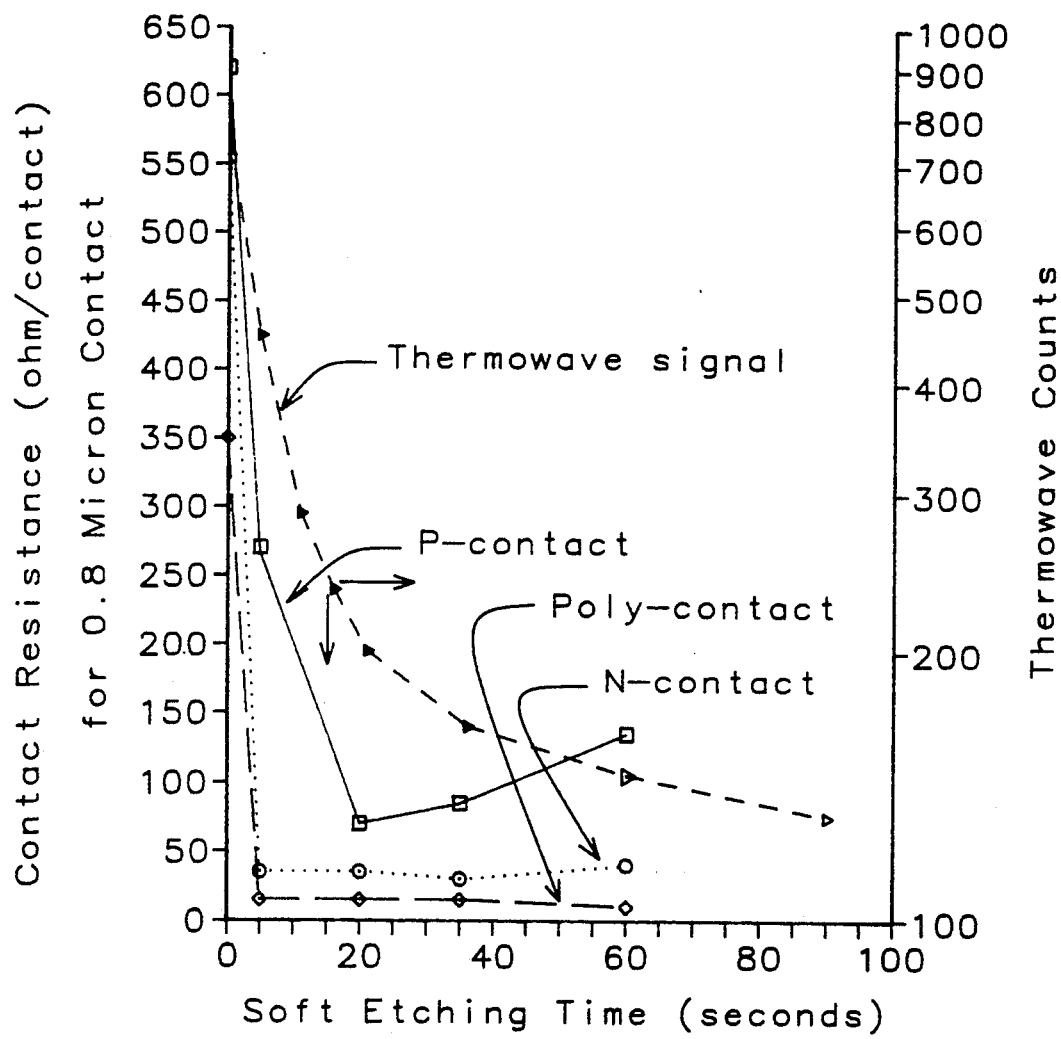
FIG. 5 shows contact resistance and thermowave counts versus post treatment time.

The results of the experiments were reviewed and it was found that the Argon sputtering does not cause subthreshold leakage increase. Metal step coverage improves with Argon sputter time. For nonsilicided, a soft etching is required to decrease the contact resistance, as shown in FIG. 5 for 1.0 micrometer contact. For silicided devices the soft-etching is not needed. Typically, for a 0.8 micrometers contact, the contact resistance is around 1.4 ohm/contact.

FIG. 5 shows the 0.8 micrometer contact resistances for metal to N-substrate, P-substrate and polysubstrate contacts respectively. Also shown is the thermowave counts as measured on silicon substrate. It can be seen that, for nonsilicided devices, the contact resistance and the thermowave counts can be reduced to normal values after 30 seconds of soft etching. FIG. 5 shows the contact resistance and thermowave counts versus post treatment time which is needed for nonsilicided devices. For silicide devices, there is no contact resistance increases due to the Argon sputtering process. It shows the contact resistance, Rc increases upon Argon sputtering, but that it can be reduced to normal values with soft etching. The soft etching used in the experiments was helium, trifluoromethane and carbon tetrafluoride. The preferred time of soft etching was 35 seconds and about 150 to 300 Angstroms of silicon was removed from the surfaces of the contact openings before the metallurgy desposition.

While the invention has been particularly shown and described with reference to the preferred embodiments thereof, it will be understood by those skilled in the art that various changes in form and details may be made without departing from the spirit and scope of the invention.

What is claimed is:

1. A method for making a contact opening for an integrated circuit in a horizontal plane having a feature size of about one micrometer or less comprising:

providing an integrated circuit structure having device elements within a semiconductor substrate and multilayer insulating layers thereover;

forming a resist masking layer over the said multilayer insulating layer having openings therein in the areas where the said contact openings are desired; isotropic etching through a thickness portion of said multilayer insulating layer;

anisotropic etching through the remaining thickness of said multilayer insulating layer to the semiconductor substrate to form said contact opening;

removing the said resist layer; and subjecting the structure to an Argon sputter etching ambient that is influenced by a magnetic field that causes preferential etching along a direction that is approximately 45 degrees to the horizontal plane to smooth the sharp corners at the upper surface of said multilayer layer and the point where the said isotropic etching ended and the anisotropic etching began.

2. The method of claim 1 wherein said multilayer layer is composed of a layer of silicon oxide and borophosphosilicate glass.

3. The method of claim 2 wherein said borophosphosphosilicate glass thickness in between about 4000 Angstroms and 10,000 Angstroms said silicon oxide thickness is between about 1000 Angstroms and 2000 Angstroms.

4. The method of claim 3 wherein said isotropic etching is continued to a thickness of about 3000 Angstroms to 4000 Angstroms of said borophosphosilicate glass.

5. The method of claim 4 wherein said Argon sputter etching continues until from between about 500 to 1250 Angstroms of material is removed during the smoothing step which results in tapering of sharp corners as a result, the metal step coverage is improved from between about 34% to 69%.

6. The method of claim 1 wherein said integrated circuit includes metal oxide semiconductor field effect transistors.

7. The method of claim 1 wherein said integrated circuit includes bipolar transistors.

8. A method for making a contact opening for an integrated circuit having a feature size of about one micrometer or less comprising:

providing an integrated circuit structure having device elements within a semiconductor substrate and multilayer insulating layers thereover;

forming a resist masking layer over the said multilayer insulating layer having openings therein in the areas where the said contact openings are desired;

isotropic etching through a thickness portion of said multilayer insulating layer;

anisotropic etching through the remaining thickness of said multilayer insulating layer to the semiconductor substrate to form said contact opening;

removing the said resist layer;

subjecting the structure to an Argon sputter etching ambient to smooth the sharp corners at the upper surface of said multilayer layer and the point where the said isotropic etching ended and the anisotropic etching began and soft reactive ion etching for a period of less than about 30 seconds after said argon sputter etching to reduce the increased contact resistance caused by this argon sputter etching.

9. The method of claim 8 wherein said soft etching uses a helium ambient plus reactive gases.

10. The method of claim 9 wherein the said reactive gases include trifluoromethane.

11. The method of claim 10 wherein the said reactive gases also include carbon tetrafluoride.

12. In the method of fabrication of a metal oxide semiconductor field effect integrated circuit having a feature size of about one micrometer or less wherein the semiconductor integrated circuit structure having device elements is covered with a silicon oxide layer and a silicate glass layer, in a horizontal plane, a process for forming tapered contact openings to device elements comprising:

forming a resist masking layer over the said silicate glass layer having openings therein in the areas where the said contact openings are desired;

isotropic etching through a thickness portion of said silicate glass layer;

anisotropic etching through the remaining thickness of said silicate glass layer and said silicon oxide layer to the semiconductor substrate to form said contact openings;

removing the said resist layer;

and subjecting the structure to an Argon sputter etching ambient to smooth the sharp corners at the upper surface of said silicate glass layer and the point where the said isotropic etching ended and the anisotropic etching began and soft reactive ion etching for a period of less than about 60 seconds after said argon sputter etching to reduce the increased contact resistance caused by this argon sputter etching.

13. The method of claim 12 wherein said silicate glass layer is composed of a layer borophosphosilicate glass having a thickness of between about 4000 Angstroms and 10000 Angstroms said silicon oxide thickness is between about 1000 Angstroms and 2000 Angstroms.

14. The method of claim 13 wherein said isotropic etching is continued to a thickness of about 3000 Angstroms to 5000 Angstroms of said borophosphosilicate glass.

15. The method of claim 14 wherein said Argon sputter etching continues until from between about 500 to 1250 Angstroms of material is removed during the smoothing step which results in tapering of sharp corners and improvement on the metal step to from between about 34% to 69%.

16. The method of claim 12 wherein said soft reactive ion etching uses a helium ambient plus reactive gases which includes carbon tetrafluoride.

17. The method of claim 16 wherein the said reactive gases include trifluoromethane.

18. The method of claim 12 wherein said contact openings are made to a refractory metal silicide layer which in turn in ohmic contact to said device elements.

19. The method of claim 12 wherein said refractory metal silicide layer is titanium silicide.

20. In the method of fabrication of a metal oxide semiconductor field effect integrated circuit having a feature size of about one micrometer or less wherein the semiconductor integrated circuit structure having device elements is covered with a silicon oxide layer and a silicate glass layer, in a horizontal plane, a process for forming tapered contact openings to device elements comprising:

forming a resist masking layer over the said silicate glass layer having openings therein in the area where the said contact openings are desired;

isotropic etching through a thickness portion of said silicate glass layer;

anisotropic etching through the remaining thickness of said silicate glass layer and said silicon oxide layer to the semiconductor substrate to form said contact openings;

removing the said resist layer; and subjecting the structure to an Argon sputter etching ambient that is influenced by a magnetic field that causes preferential etch in a direction approximately 45 degrees to the horizontal plane, to smooth the sharp corners at the upper surface of said silicate glass layer and the point where the said isotropic etching ended and the anisotropic etching began.

* * * * *